(12) United States Patent
Fornage

(10) Patent No.: US 7,923,983 B2
(45) Date of Patent: Apr. 12, 2011

(54) METHOD AND APPARATUS FOR MEASURING AC VOLTAGES

(75) Inventor: Martin Fornage, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 253 days.

(21) Appl. No.: 12/381,809

(22) Filed: Mar. 17, 2009

(65) Prior Publication Data

US 2009/0243587 A1  Oct. 1, 2009

Related U.S. Application Data

(60) Provisional application No. 61/070,797, filed on Mar. 26, 2008.

(51) Int. Cl.
  *G01R 19/00* (2006.01)
  *G01R 31/08* (2006.01)
  *G06F 19/00* (2006.01)
(52) U.S. Cl. ......................... 324/76.11; 324/522; 702/64
(58) Field of Classification Search ............... 324/76.11, 324/522; 702/1, 57, 64; 340/660, 662, 663
  See application file for complete search history.

(56) References Cited

U.S. PATENT DOCUMENTS

| | | | |
|---|---|---|---|
| 5,389,882 A * | 2/1995 | l'Anson et al. | ............... 324/522 |
| 5,701,253 A | 12/1997 | Mayell et al. | |
| 6,002,966 A * | 12/1999 | Loeb et al. | ...................... 607/57 |
| 6,639,421 B1 | 10/2003 | Yoshino et al. | |
| 7,222,358 B2 * | 5/2007 | Levinson et al. | ............. 725/121 |
| 2008/0265901 A1 | 10/2008 | Shimizu | |

FOREIGN PATENT DOCUMENTS

JP  2002323517 A  11/2002

OTHER PUBLICATIONS

"Inverters, Converters, Controllers and Interconnection System Equipment for Use With Distributed Energy Resources," Underwriters Laboratories Inc., UL Standard 1741.1, May 7, 1999, downloaded from web site http://ulstandardsinfonet.ul.com/scopes/1741.html on Jun. 12, 2009.
"IEEE Standard for Interconnecting Distributed Resources with Electric Power Systems," IEEE Std 1547™ -2003, IEEE, Jul. 28, 2003, Copyright 2003 by the Institute of Electrical and Electronics Engineers, Inc.
International Search Report and Written Opinion mailed Jul. 31, 2009 for PCT Application No. PCT/US2009/037393.

* cited by examiner

*Primary Examiner* — Hoai-An D Nguyen

(74) *Attorney, Agent, or Firm* — Moser IP Law Group

(57) ABSTRACT

A method and apparatus for providing AC voltage measurements. The apparatus includes an AC voltage monitor for determining at least a first and a second voltage representing an AC voltage of an AC circuit, generating a serial data stream frame including data representing the at least a first and a second voltage, and transmitting the serial data stream frame.

17 Claims, 4 Drawing Sheets

METHOD AND APPARATUS FOR MEASURING AC VOLTAGES

CROSS-REFERENCE TO RELATED APPLICATIONS

This application claims benefit of U.S. provisional patent application Ser. No. 61/070,797, filed Mar. 26, 2008, which is herein incorporated in its entirety by reference.

BACKGROUND OF THE INVENTION

1. Field of the Invention

Embodiments of the present invention generally relate to a method and apparatus for measuring AC voltages.

2. Description of the Related Art

In today's quest for obtaining energy from renewable resources, solar power is becoming an increasingly desirable option. Photovoltaic (PV) modules utilized in solar power systems convert energy from sunlight received into direct current (DC). The PV modules cannot store the electrical energy they produce, so the energy must either be dispersed to an energy storage system, such as a battery or pumped hydro-electricity storage, or dispersed by a load. One option to use the energy produced is to employ one or more inverters to convert the DC current into an alternating current (AC) and couple the AC current to the commercial power grid.

PV power inverters coupled to the commercial power grid must constantly monitor the voltage of the Utility Power (grid) at the inverter location to comply with relevant Underwriters Laboratories (UL) and Institute of Electrical and Electronic Engineers (IEEE) standards, in particular UL-1741 ed. 1 "Standard for Inverters, Converters, Controllers and Interconnection System Equipment for Use with Distributed Energy Resources", May 1999, and IEEE 1547-2003 "IEEE Standard for Interconnecting Distributed Resources with Electric Power Systems". Additionally, other devices that may be coupled to the grid, such as uninterruptable power supplies (UPS), must also monitor the grid power and comply with certain isolation standards.

In monitoring the grid, each phase of the grid voltage must be monitored and measured separately. Traditionally, grid monitoring circuits utilize transformers to isolate and step-down the grid voltages before sampling the AC voltage on each phase of the grid. Such transformers are bulky, heavy, and expensive. Additionally, these transformers continuously consume power and may exhibit distortion problems.

Therefore, there is a need for a method and apparatus to efficiently measure AC voltages.

SUMMARY OF THE INVENTION

Embodiments of the present invention generally relate to a method and apparatus for providing AC voltage measurements. The apparatus comprises an AC voltage monitor for determining at least a first and a second voltage representing an AC voltage of an AC circuit, generating a serial data stream frame comprising data representing the at least a first and a second voltage, and transmitting the serial data stream frame.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
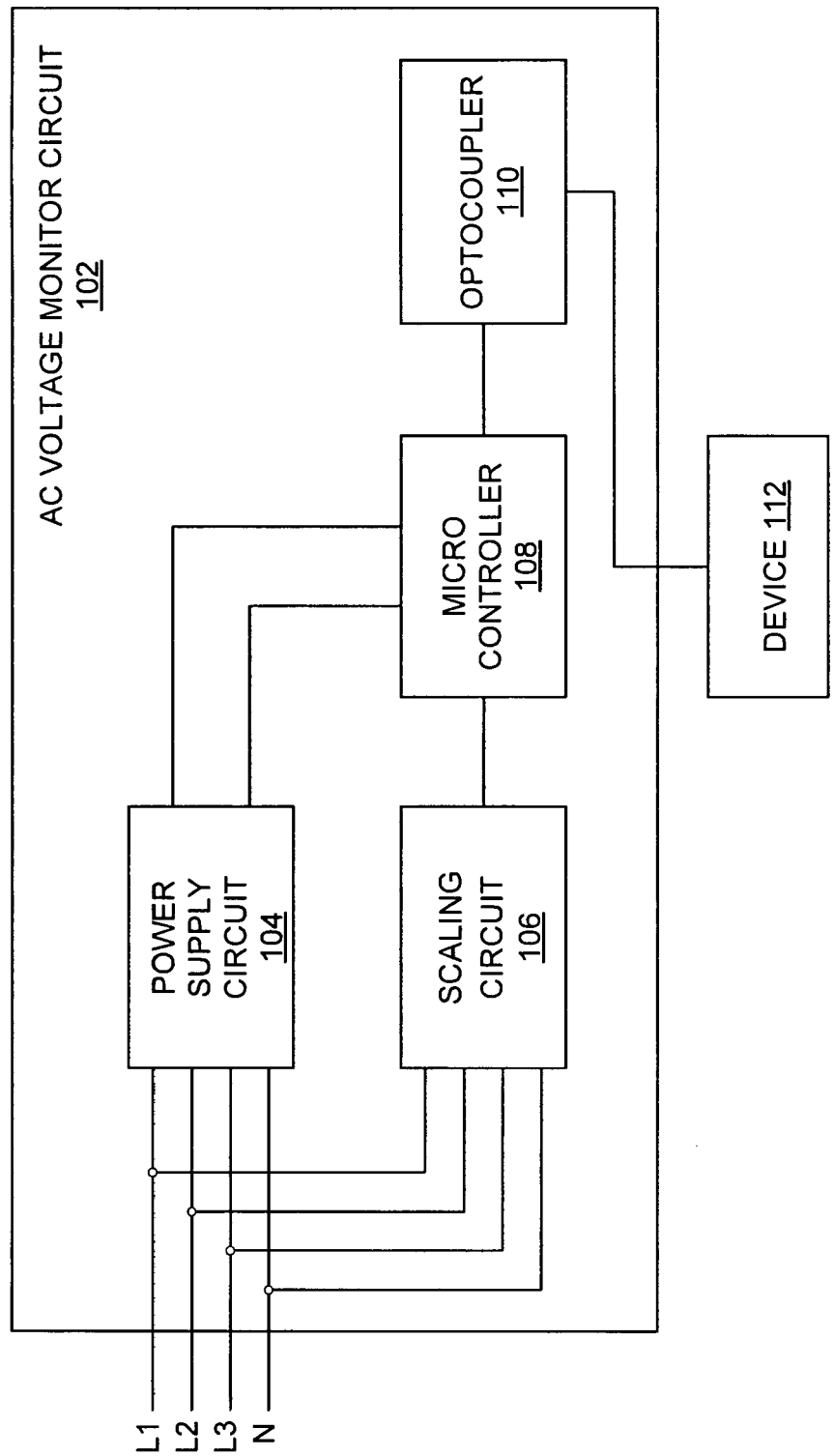
FIG. 1 is a block diagram of an AC voltage monitor for providing isolated AC voltage monitoring in accordance with one or more embodiments of the present invention.

FIG. 1 is a block diagram of an AC voltage monitor 102 for providing isolated AC voltage monitoring in accordance with one or more embodiments of the present invention. The AC voltage monitor 102 is coupled to a three-phase AC commercial power grid ("grid") and to a device 112, and comprises a power supply circuit 104, a scaling circuit 106, a microcontroller 108, and an optocoupler 110 (i.e., a solid state isolation device). In some embodiments, the power supply circuit 104 may be a state of the art AC/DC converter (e.g., a diode bridge, capacitor and flyback converter). The device 112 may be any device requiring voltage measurements from an AC line, such as a UPS, inverter, micro-inverter, and the like.

The power supply circuit 104 is coupled to each line of the grid, i.e., L1, L2, L3, and N; lines L1, L2, and L3 carry a first, a second, and a third phase, respectively, of a three-phase AC voltage on the grid ("grid voltage"), and line N provides a neutral line. The power supply circuit 104 is additionally coupled, via two output terminals, to the microcontroller 108 and generates DC power from the grid voltage for powering the microcontroller 108.

In addition to the power supply circuit 104, the scaling circuit 106 is also coupled to each line of the grid and to the microcontroller 108. The scaling circuit 106 couples a scaled version of the grid voltage ("scaled grid voltage") to the microcontroller 108; in some embodiments, such a scaled grid voltage comprises a reduction of the grid voltage by two orders of magnitude. The microcontroller 108 samples (i.e., measures) the voltage on each phase of the scaled grid voltage, as well as the scaled neutral line voltage, and generates a serial data stream comprising line-to-neutral voltage data representing each phase of the grid voltage (i.e., a digital representation of the three-phase AC grid voltage). The microcontroller 108 transmits the serial data stream through the optocoupler 110 to the device 112 in order to provide electrical isolation between the device 112 and the grid; in one or more other embodiments, an alternative solid state isolation device may be utilized in place of the optocoupler 110.

In alternative embodiments, the AC voltage monitor 102 may be coupled to an alternate three-phase AC voltage source or to a two-phase or single-phase AC voltage source.

Figure 2:
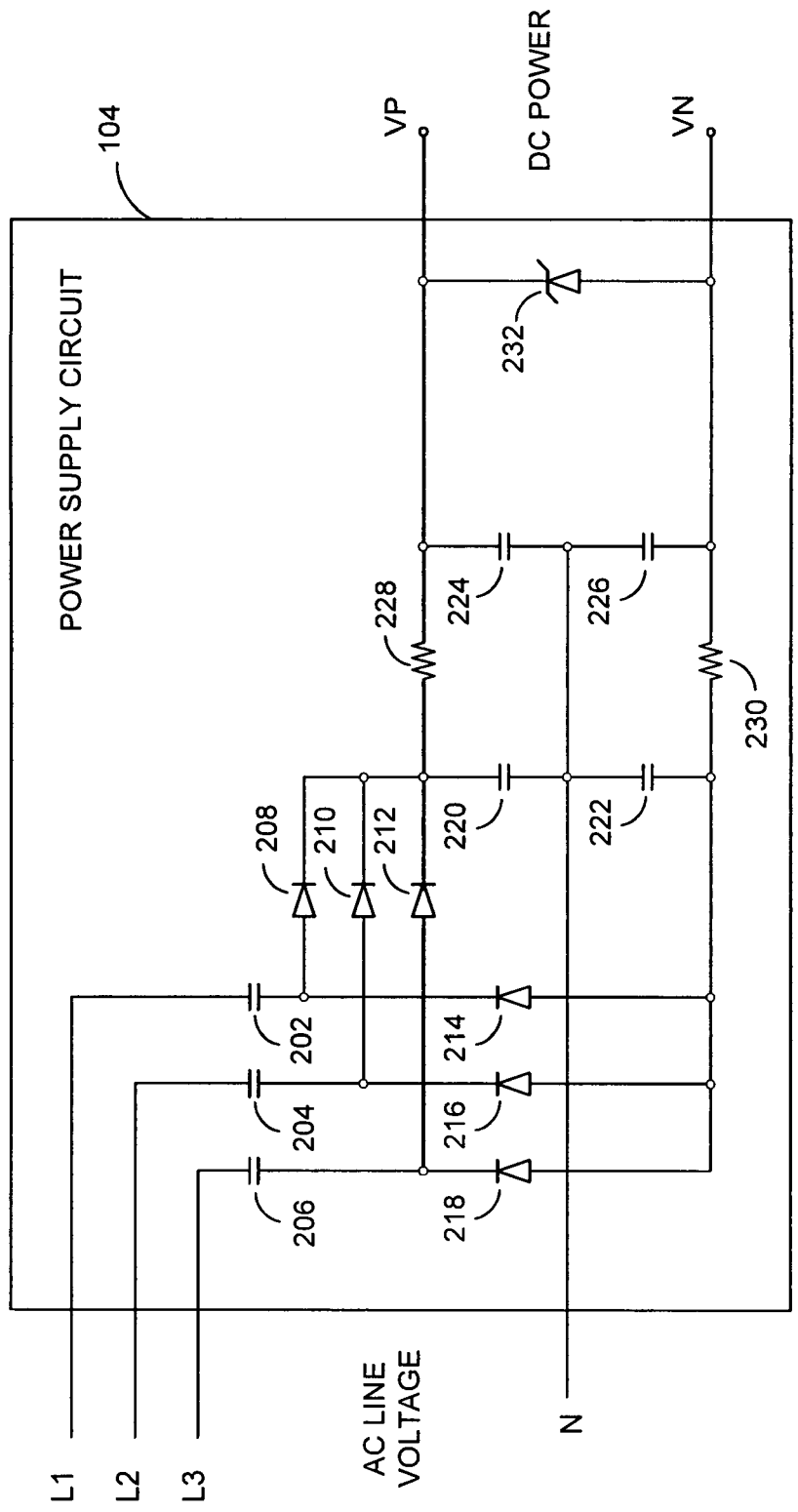
FIG. 2 is a block diagram of a power supply circuit in accordance with one or more embodiments of the present invention.

FIG. 2 is a block diagram of a power supply circuit 104 in accordance with one or more embodiments of the present invention. The power supply circuit 104 converts AC power from the grid to DC power for powering digital electronics of the microcontroller 108.

The power supply circuit 104 comprises capacitors 202, 204, 206, 220, 222, 224, and 226; diodes 208, 210, 212, 214, 216, and 218; resistors 228 and 230; and zener diode 232.

First terminals of the capacitors 202, 204, and 206 are coupled to the lines L1, L2, and L3, respectively. Second terminals of the capacitors 202, 204, and 206 are coupled to cathode terminals of the diodes 214, 216, and 218, respectively, and anode terminals of the diodes 208, 210, and 212, respectively. Cathode terminals of the diodes 208, 210, and 212 are coupled to a first terminal of the capacitor 220 and a first terminal of a resistor R1. A second terminal of the resistor R1 is coupled to a first terminal of the capacitor 224, an anode terminal of the zener diode 232, and an output terminal "VP" of the power supply circuit 104. A second terminal of the capacitor 220 is coupled to a second terminal of the capacitor 224, a first terminal of the capacitor 222, a first terminal of the capacitor 226, and the neutral line. A resistor R2 is coupled across the second terminals of the capacitors 222 and 226. The second terminal of the capacitor 226 is further coupled to an anode terminal of the zener diode 232 and an output terminal "VN" of the power supply circuit 104.

A high voltage/low frequency AC voltage from the grid is present across each of the capacitors 202, 204, and 206, resulting in a small amount of current through such capacitors and thereby limiting current flow in the circuit. The current flow through the capacitors 202, 204, and 206 is rectified by the diodes 214, 216, 218, 208, 210, and 212, and charges capacitors 220 and 222 depending upon the phase of the grid voltage. Additionally, the capacitors 220 and 222 provide protection against any voltage surges from the grid by absorbing the additional energy passing through the capacitors 202, 204, and 206. Capacitors 220 and 222 generally are orders of magnitude greater than the capacitors 202, 204, and 206, but do not require being rated for high voltage. In some embodiments, the capacitors 220 and 222 may be on the order of 1 microfarad, while the capacitors 202, 204, and 206 may be on the order of tens of microfarads.

The rectified current is smoothed by the resistors 228/230 and the capacitors 224/226, and subsequently stabilized by the zener diode 232. The zener diode 232 sets the output voltage magnitude at the zener voltage for providing a low voltage DC supply to power the microcontroller 108, for example on the order of 3-5 volts. In alternative embodiments, the zener diode 232 may be replaced by a different voltage reference to regulate the output voltage across VP and VN.

Figure 3:
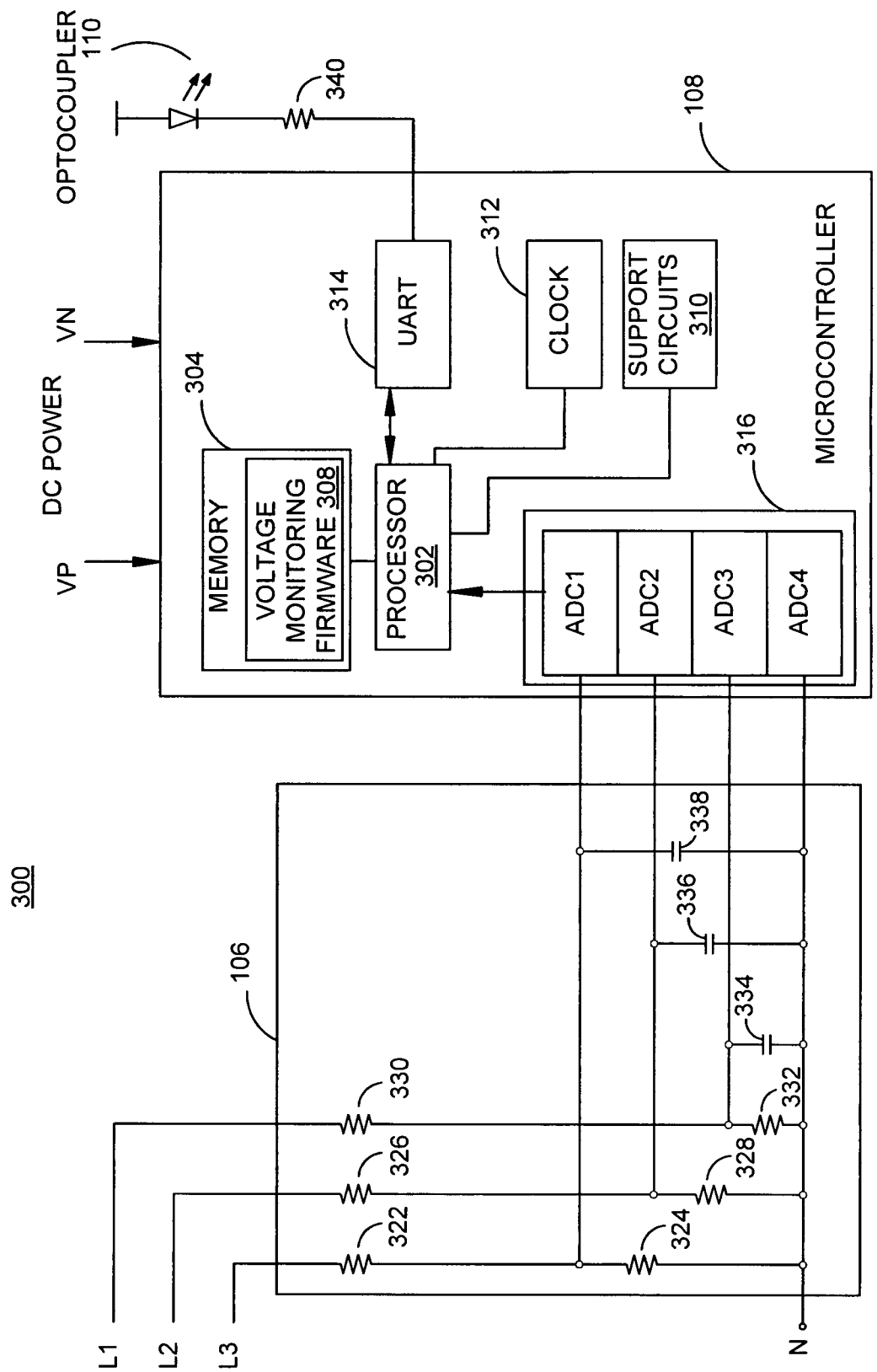
FIG. 3 depicts a block diagram of a scaling circuit, a microcontroller, and an optocoupler in accordance with one or more embodiments of the present invention.

FIG. 3 is a block diagram of a scaling circuit 106, a microcontroller 108, and an optocoupler 110 in accordance with one or more embodiments of the present invention. The scaling circuit 106 comprises resistors 322, 324, 326, 328, 330, and 332. The resistor pairs 322/324, 326/328, and 330/332 are each coupled in series across lines L1 and N, L2 and N, L3 and N, respectively, forming voltage dividers between each phase of the grid and the neutral line N. Resistance values may be selected such that each voltage divider is a high-ratio voltage divider, for example dividing each voltage by a factor of one hundred. In some embodiments, capacitors 334, 336, and 338 are coupled across the resistors 332, 328, and 324, respectively, to provide low-pass filtering.

The scaling circuit 106 provides a scaled version of the three-phase AC grid voltage ("scaled grid voltage"), i.e., a representative sample of the voltage on each phase and neutral line of the grid, to the microcontroller 108 for digitizing and processing.

The microcontroller 108 may be a conventionally available microcontroller, such as a Programmable Intelligent Computer (PIC). The microcontroller 108 is comprised of a processor 302 coupled to a memory 304, support circuits 310, clock circuits 312, universal asynchronous receiver-transmitter (UART) 314, and analog-to-digital converter (ADC) bank 316. The processor 302 may comprise one or more conventionally available microprocessors; additionally and/or alternatively, the processor 302 may include one or more application specific integrated circuits (ASICs). The support circuits 310 are well known circuits used to promote functionality of the processor 302, such as but not limited to a cache, power supplies, clock circuits, buses, network cards, input/output (I/O) circuits, and the like.

The memory 304 may comprise random access memory, read only memory, removable disk memory, flash memory, and various combinations of these types of memory. The memory 304 is sometimes referred to as main memory and may, in part, be used as cache memory or buffer memory. Additionally, the memory 304 may store various forms of application software and/or firmware, such as voltage monitoring firmware 308 for determining the line-to-neutral voltage data based on digitized samples of the grid voltage and determining framing information for the serial data stream. The clock circuits 312 support the microcontroller 108 by providing timing signals. UART 314 transmits the serial data stream to the device 112.

The microcontroller 108 samples (i.e., measures) and digitizes the scaled grid voltage via the ADC bank 316. The ADC bank 316 is comprised of analog to digital converters ADC1, ADC2, ADC3, and ADC4 for sampling and digitizing the scaled grid voltages from lines L3, L2, L1, and N, respectively. The line-to-neutral voltages (VL1N, VL2N, and VL3N) for each phase of the grid voltage are computed by subtracting the sampled neutral voltage from the sampled phase voltages:

$$VL1N = VL1 - VN \tag{1}$$

$$VL2N = VL2 - VN \tag{2}$$

$$VL3N = VL3 - VN \tag{3}$$

Where VL1, VL2, and VL3, are the voltage samples representing the voltages on lines L1, L2, and L3, respectively, and VN is the voltage sample representing the voltage on the neutral line. Generally, the voltages VL1, VL2, VL3, and VN are measured sequentially and the line-to-neutral voltages computed immediately thereafter, for example within a few microseconds, thereby allowing for a rapid refresh rate.

For each set of line-to-neutral voltages computed, the processor 302 constructs a frame word for identifying a serial data stream frame comprising the line-to-neutral voltage data. In some embodiments, the frame word may be constructed utilizing a 4-bit frame counter (e.g., 0000, 0001, 0010), a 4-bit parity or cyclic redundancy check (CRC) code, and the like; in alternative embodiments, more or fewer bits may be utilized. The frame word may also be padded to a length that is identical to the length of the words for each of the computed line-to-neutral voltages.

The line-to-neutral voltage data and the frame word are coupled to the UART 314 for transmission as a serial data stream frame; in some embodiments, the UART 314 may utilize settings such as one start bit, eight to ten data bits, one optional parity bit, and one stop bit for transmitting each word. Each frame of the serial data stream comprises data representing the computed line-to-neutral voltage for each phase of the grid, as well as the frame word to identify the frame within the serial data stream. For example, each serial data stream frame may be transmitted as a sequence of words "VL1N, VL2N, VL3N, frame word".

The UART 314 transmits the serial data stream frame to the device 112 via the optocoupler 110, where the optocoupler 110 provides electrical isolation between the device 112 and the grid. In some embodiments, a resistor 340 may be coupled between the UART 314 and the optocoupler 110.

Upon receiving the transmitted serial data stream, the device 112 may utilize the line-to-neutral voltage data to determine various information pertaining to the grid voltage, such as line-to-line instantaneous voltages, line-to-line phase angles, line RMS voltages, zero crossing information, and the like. In some embodiments, framing criteria utilized by the device 112 for determining a valid in-frame condition may consist of four contiguous valid frame counter nibbles received. Out-of-frame criteria may consist of receiving two contiguous erroneous frame counter nibbles, or two contiguous parity or CRC errors. During out-of-frame periods, the device 112 discards the corresponding line-to-neutral voltage data received.

Figure 4:
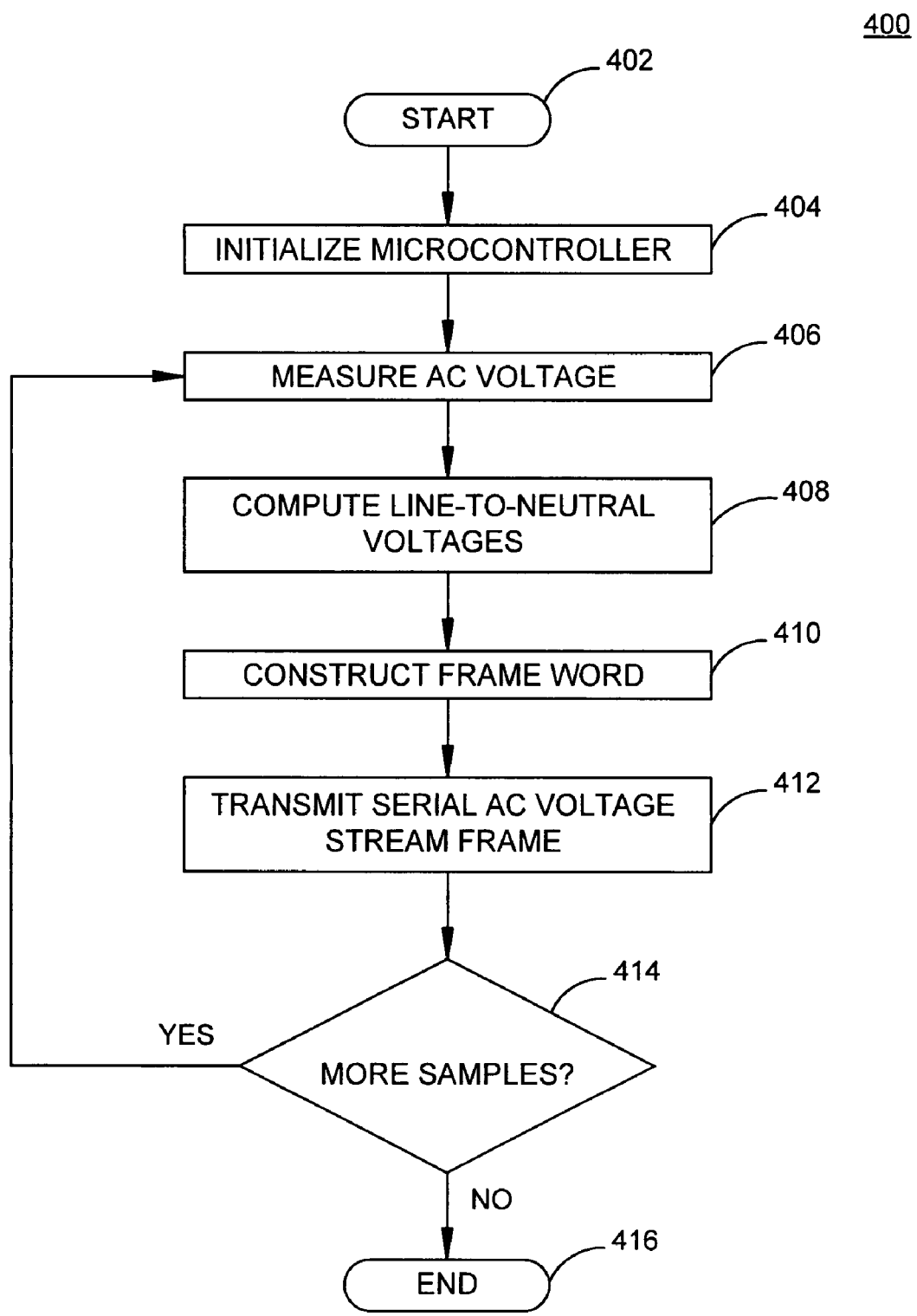
FIG. 4 is a method 400 for isolated AC voltage monitoring in accordance with one or more embodiments of the present invention.

FIG. 4 is a flow diagram of a method 400 for isolated AC voltage monitoring in accordance with one or more embodiments of the present invention. In some embodiments, such as the embodiment described below, an AC voltage monitor (e.g., the AC voltage monitor 102) is coupled to a multi-phase AC power source, for example a three-phase commercial power grid; alternatively, the AC voltage monitor may be coupled to a different three-phase AC power source or a two-phase or single-phase AC power source. The AC voltage monitor is further coupled to a device requiring isolated monitoring of the AC voltages from the AC power source. In some embodiments, the AC voltage monitor may comprise a power supply circuit, such as a state of the art AC/DC converter (e.g., a diode bridge, capacitor and flyback converter), for converting AC power from the AC power source to DC power for powering digital electronics of the AC voltage monitor.

The method 400 begins at step 402 and proceeds to step 404, where a microcontroller of the AC voltage monitor is initialized. At step 406, the microcontroller samples (i.e., measures) the AC line voltage on each line of the AC power source via an ADC bank, such as ADC bank 316. For example, for a three-phase AC power source, the voltage on each phase (i.e., lines L1, L2, and L3) is sampled as well as the voltage on the neutral line (i.e., N). The resulting digitized samples provide an accurate representation of the actual voltage on each line (each phase and neutral line) of the AC power source. In some embodiments, the AC voltages from the AC power source may be scaled, for example by a voltage divider, and/or low-pass filtered prior to being sampled.

The method 400 proceeds to step 408. At step 408, a line-to-neutral voltage is computed for each phase by subtracting the sampled neutral line voltage from each sampled phase voltage (i.e., the sampled voltages from L1, L2, and L3). Generally, the voltages on each line of the AC power source are measured sequentially and the line-to-neutral voltages computed immediately thereafter, for example within a few microseconds, allowing for a rapid refresh rate.

At step 410, a frame word is constructed. In some embodiments, the frame word may be constructed utilizing a 4-bit frame counter (e.g., 0000, 0001, 0010), a 4-bit parity or cyclic redundancy check (CRC) code, and the like; in alternative embodiments, fewer or more bits may be utilized. Additionally, the frame word may be padded to a length that is identical to the length of the words for each of the computed line-to-neutral voltages.

At step 412, data representing the computed line-to-neutral voltages and the frame word is transmitted as a frame of a serial AC voltage stream, for example by a universal asynchronous receiver-transmitter (UART), to the device. The serial data stream frame is transmitted to the device via a solid state isolation device, such as an optocoupler, to provide isolation between the device and the AC power source.

Upon receiving the transmitted serial data stream frame, the device may utilize the line-to-neutral voltage data to determine various information pertaining to the grid voltage, such as line-to-line instantaneous voltages, line-to-line phase angles, line RMS voltages, zero crossing information, and the like. In some embodiments, framing criteria utilized by the device for determining a valid in-frame condition may consist of four contiguous valid frame counter nibbles received. Out-of-frame criteria may consist of receiving two contiguous erroneous frame counter nibbles, or two contiguous parity/CRC errors. During out-of-frame periods, the device discards the corresponding line-to-neutral voltage data received.

The method 400 proceeds to step 414, where a determination is made whether another set of line-to-neutral voltages are to be computed and transmitted. If the result of such determination is yes, the method 400 returns to step 406. If the result of the determination at step 414 is no, the method 400 proceeds to step 416 where it ends.

While the foregoing is directed to embodiments of the present invention, other and further embodiments of the invention may be devised without departing from the basic scope thereof, and the scope thereof is determined by the claims that follow.

The invention claimed is:

1. Apparatus for providing AC voltage measurements, comprising:
   an AC voltage monitor for determining at least a first and a second voltage representing an AC voltage of an AC circuit, generating a serial data stream frame comprising data representing the at least a first and a second voltage, and transmitting the serial data stream frame; and
   wherein the AC voltage monitor obtains a first, a second, and a third voltage sample of the AC voltage and computes a difference between the first and the third voltage samples and a difference between the second and the third voltage samples to obtain the first voltage and the second voltage, respectively.

2. The apparatus of claim 1, further comprising a scaling circuit for scaling the AC voltage prior to obtaining the first, second, and third voltage samples.

3. The apparatus of claim 1, further comprising a solid state isolation device for providing electrical isolation between the AC circuit and a device, wherein the serial data stream frame is transmitted to the device via the solid state isolation device.

4. The apparatus of claim 1, wherein the serial data stream frame additionally comprises a frame word for identifying the serial data stream frame.

5. The apparatus of claim 4, wherein the frame word is constructed utilizing at least one of a frame counter, a parity code, or a cyclic redundancy check (CRC) code.

6. The apparatus of claim 3, wherein the sold state isolation device is an optocoupler.

7. A method for providing AC voltage measurements, comprising:
   determining at least a first and a second voltage representing an AC voltage of an AC circuit;
   creating a serial data stream frame comprising data representing the at least a first and a second voltage;
   transmitting the serial data stream frame; and
   wherein the determining at least a first and a second voltage comprises:
   obtaining a first, a second, and a third voltage sample of the AC voltage; and computing a difference between the first and the third voltage samples and a difference between the second and the third voltage samples.

8. The method of claim 7, further comprising scaling the AC voltage prior to the obtaining.

9. The method of claim 7, further comprising generating a DC voltage from the AC voltage for operating an AC voltage monitor performing the determining, creating, and transmitting.

10. The method of claim 7, further comprising providing electrical isolation between the AC circuit and a device receiving the serial data stream.

11. The method of claim 7, further comprising:
generating a frame word for identifying the serial data stream frame; and
incorporating the frame word into the serial data stream frame, wherein the generating and the incorporating are performed prior to the transmitting.

12. The method of claim 11, wherein the frame word is generated utilizing at least one of a frame counter, a parity code, or a cyclic redundancy check (CRC) code.

13. A system for providing AC voltage measurements, comprising:
an AC voltage monitor for (i) generating a plurality of serial data stream frames, each of the plurality of serial data stream frames comprising data representing at least a first and a second voltage of an AC voltage of an AC circuit and a frame word, and (ii) transmitting the plurality of serial data stream frames as a serial data stream;
a device for receiving the serial data stream transmitted from the AC voltage monitor; and
wherein the AC voltage monitor obtains a first, a second, and a third voltage sample of the AC voltage and computes a difference between the first and the third voltage samples and a difference between the second and the third voltage samples to obtain the first voltage and the second voltage, respectively.

14. The system of claim 13, further comprising an optocoupler for providing electrical isolation between the AC circuit and the device, wherein the serial data stream is transmitted via the optocoupler.

15. The system of claim 13, wherein the frame word is constructed utilizing at least one of a frame counter, a parity code, or a cyclic redundancy check (CRC) code.

16. The system of claim 15, wherein the device determines a valid in-frame condition upon receiving at least four contiguous valid frame counter nibbles.

17. The system of claim 15, wherein the device determines an out-of-frame condition upon receiving at least one of two contiguous erroneous frame counter nibbles, two contiguous parity errors, or two contiguous CRC errors.

* * * * *